United States Patent
Buehman et al.

(10) Patent No.: US 11,284,531 B2
(45) Date of Patent: Mar. 22, 2022

(54) EJECTOR FOR ELECTRIC MODULES

(71) Applicant: ERICO INTERNATIONAL CORPORATION, Solon, OH (US)

(72) Inventors: Erika Lynn Buehman, Macedonia, OH (US); Gregory Dean Holder, Chagrin Falls, OH (US)

(73) Assignee: ERICO International Corporation, Solon, OH (US)

( * ) Notice: Subject to any disclaimer, the term of this patent is extended or adjusted under 35 U.S.C. 154(b) by 33 days.

(21) Appl. No.: 16/416,745

(22) Filed: May 20, 2019

(65) Prior Publication Data

US 2019/0364685 A1 Nov. 28, 2019

Related U.S. Application Data

(60) Provisional application No. 62/675,400, filed on May 23, 2018.

(51) Int. Cl.
| | |
|---|---|
| *H05K 7/14* | (2006.01) |
| *H05K 5/02* | (2006.01) |
| *H05K 5/00* | (2006.01) |

(52) U.S. Cl.
CPC ......... *H05K 7/1401* (2013.01); *H05K 5/0021* (2013.01); *H05K 5/0221* (2013.01)

(58) Field of Classification Search
CPC .. H05K 7/1401; H05K 5/0021; H05K 5/0221; H05K 7/1409
See application file for complete search history.

(56) References Cited

U.S. PATENT DOCUMENTS

| | | |
|---|---|---|
| 4,083,616 A | 4/1978 | McNiece et al. |
| 5,035,634 A | 7/1991 | Hasircoglu et al. |
| 6,396,703 B1 | 5/2002 | White |
| 6,443,315 B1 | 9/2002 | Tabuchi |
| 6,916,190 B2 | 7/2005 | Joist |
| 6,955,550 B2 | 10/2005 | Schlack |
| 7,070,431 B1 | 7/2006 | White |
| 7,193,856 B2 | 3/2007 | Hidaka |
| 7,284,997 B2 | 10/2007 | Joist |
| 7,817,414 B2 | 10/2010 | Chou et al. |
| 8,435,057 B1 | 5/2013 | Jun et al. |
| 8,611,103 B2 | 12/2013 | Thomas et al. |
| 8,887,372 B2 | 11/2014 | Bridges |
| 10,058,006 B2 | 8/2018 | Hung et al. |
| 10,117,350 B2 | 10/2018 | Kuang et al. |
| 10,206,302 B2 | 2/2019 | Liao |
| 2010/0175231 A1* | 7/2010 | Lux ........................ H02B 1/052 24/593.1 |
| 2010/0183365 A1* | 7/2010 | Deinhardt ............ H05K 7/1409 403/322.4 |
| 2018/0160563 A1 | 6/2018 | Hung et al. |

(Continued)

FOREIGN PATENT DOCUMENTS

| | | | |
|---|---|---|---|
| CN | 206481053 | * 9/2017 | ............... H02H 9/04 |
| EP | 1463394 A1 | 9/2019 | |

*Primary Examiner* — James Wu
*Assistant Examiner* — Hung Q Dang
(74) *Attorney, Agent, or Firm* — Quarles & Brady LLP

(57) ABSTRACT

An ejector can be provided for a surge protection module that is configured to be engaged with a base for operation. The ejector can include a lever that is configured to pivot relative to the base to eject the surge protection module from engagement with the base.

16 Claims, 15 Drawing Sheets

(56) References Cited

U.S. PATENT DOCUMENTS

| | | |
|---|---|---|
| 2018/0168061 A1 | 6/2018 | Liao |
| 2019/0075666 A1 | 3/2019 | Ehlen |
| 2019/0075667 A1 | 3/2019 | Ehlen |

* cited by examiner

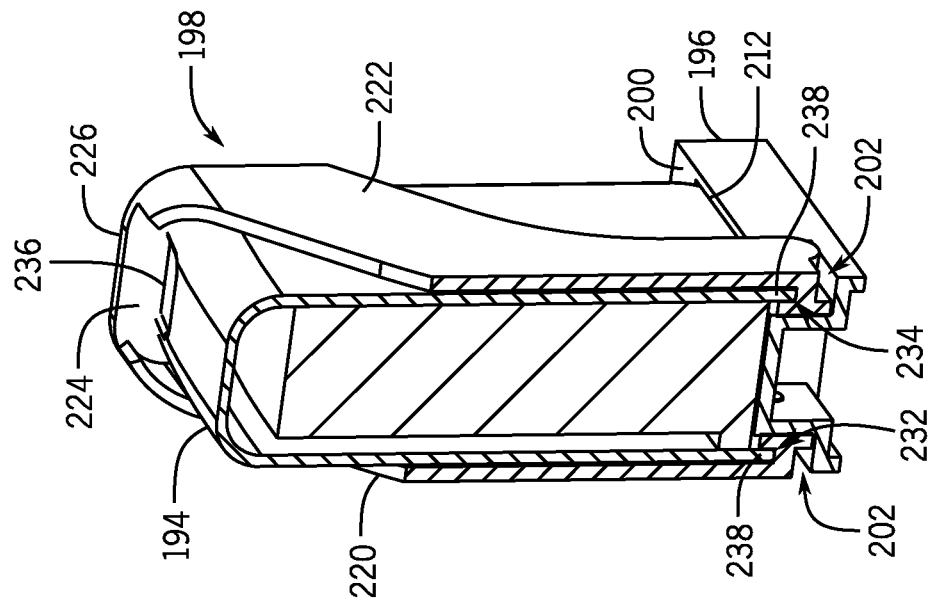
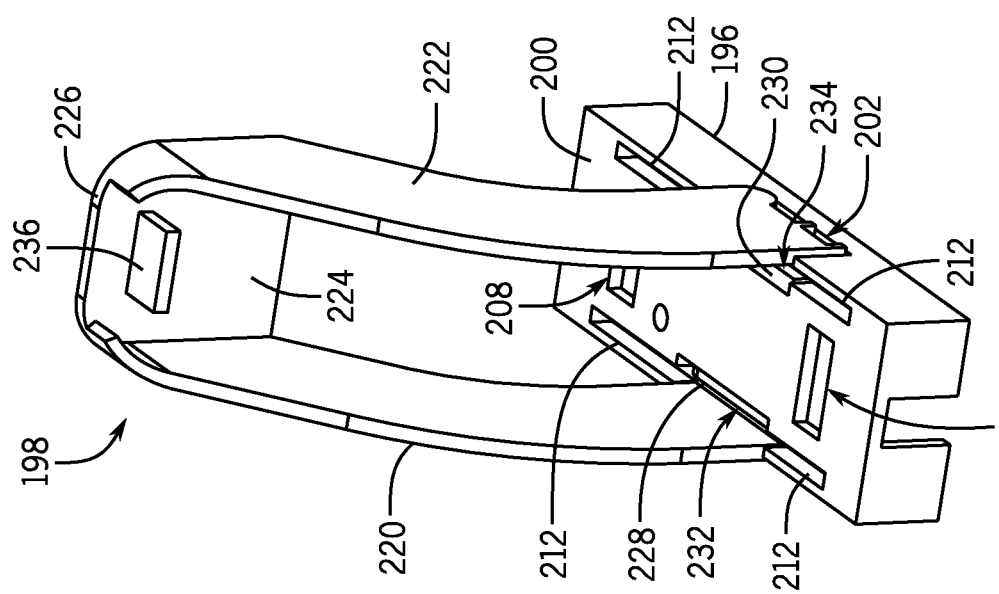

EJECTOR FOR ELECTRIC MODULES

CROSS-REFERENCE TO RELATED APPLICATIONS

This application claims priority to U.S. Provisional Patent Application No. 62/675,400, titled "Ejector for Electric Modules" and filed on May 23, 2018, the entirety of which is incorporated herein by reference.

BACKGROUND

It may be useful, or even required by certain codes and standards, to provide surge protection devices ("SPDs") for electrical installations. In some configurations, a base can be provided to receive one or more SPDs, in order to appropriately secure the surge protection devices for operation.

SUMMARY

Some embodiments of the invention provide an ejector for use with an electric module that is configured to be engaged with a base for operation. An ejector body can be secured to the base. The ejection body can be configured to move relative to the base to eject the electric module from engagement with the base.

Some embodiments of the invention provide a surge protector device for use with a surge protection module. A base can be configured to receive the surge protection module for operation. An ejector can include a lever and can be secured to the base. The ejector can be configured to be manually moved relative to the base to pivot the lever, to eject the electric module from engagement with the base.

Some embodiments of the invention provide a surge protection system for use with a surge protection module. A base can be configured to receive the surge protection module for operation. An ejector lever can be pivotably secured to the base at a first pivot point, the ejector lever being integrally formed to include a first leg, a first ejection feature that extends from the first leg, and a manual-engagement feature. The first leg can be configured to extend from the first pivot point along a first side of the surge protection module, with the surge protection module secured to the base. The manual-engagement feature can be configured to be manually engaged to pivot the ejector lever relative to the base, about the first pivot point, to urge the first ejection feature into engagement with the surge protection module and thereby eject the surge protection module from engagement with the base.

Some embodiments of the invention provide an ejector for a surge protection module, the surge protection module configured to be engaged with a base for operation. An ejector lever, can be pivotably secured to the base but not to the surge protection module. The ejector lever can be configured to be manually pivoted relative to the base, from an engaged orientation to an ejection orientation, without being disconnected from the base, to eject the surge protection module from engagement with the base. The ejector lever can be configured to be automatically pivoted by the surge protection module, from the ejection orientation to the engaged orientation, as the surge protection module is engaged with the base.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 14A is an isometric view of the engagement block and the ejector lever of FIGS. 12 and 13, with the ejector lever in an engaged orientation.

FIG. 14B is an isometric sectional view of the engagement block, the ejector lever, and the SPD module of FIGS. 12 and 13, with the SPD module secured to the engagement block and the ejector lever in an engaged orientation

DETAILED DESCRIPTION

Figure 1:
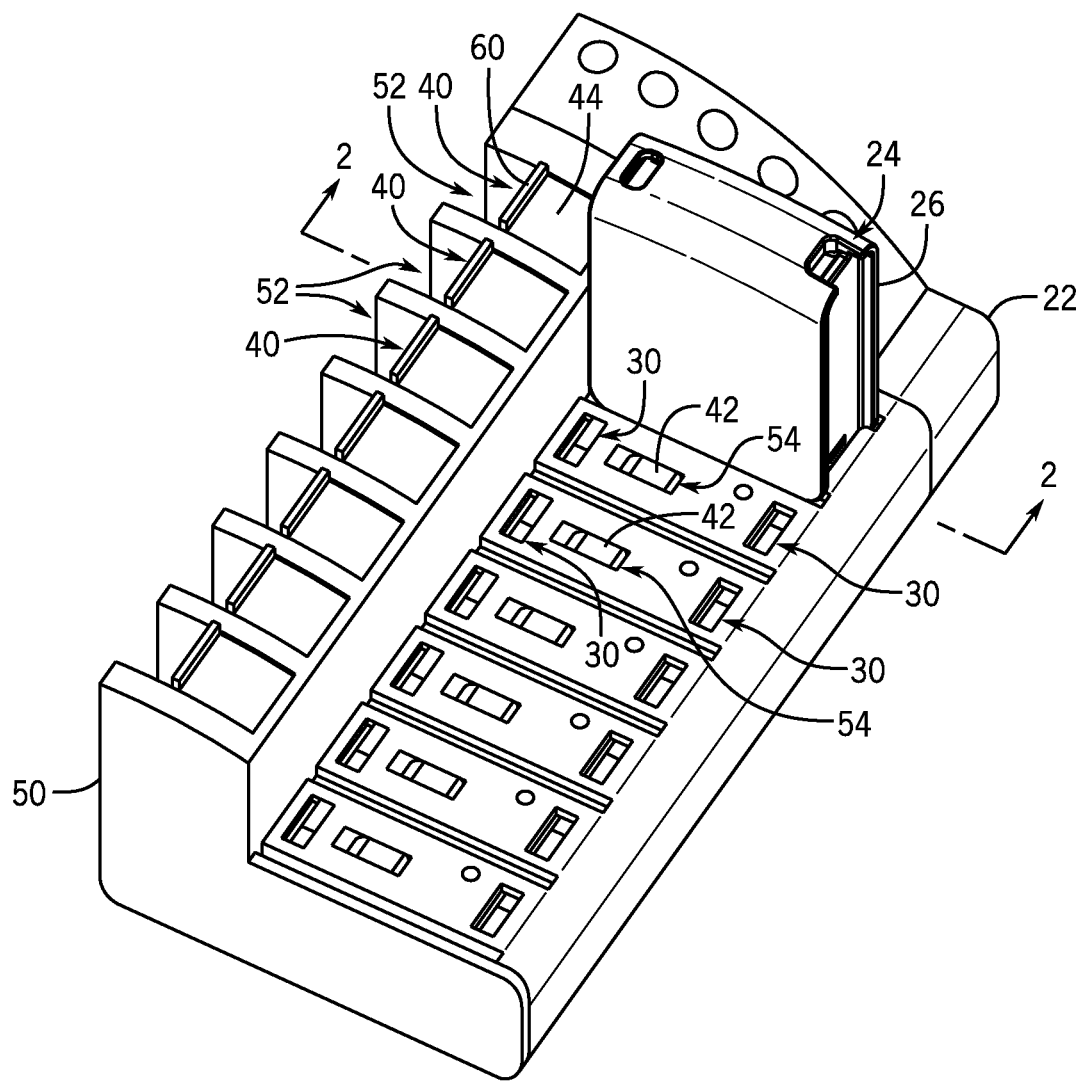
FIG. 1 is an isometric view of a surge protection system according to an embodiment of the invention, including a base, multiple ejectors in engaged configurations, and an SPD module installed for operation.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising,"

or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise limited or defined, discussion of particular directions is provided by example only, with regard to particular embodiments or relevant illustrations. For example, discussion of "downward" movement or forces is generally intended as a description only of example movements or forces, relative to a reference frame of a particular example or illustration, and is not intended to require an absolute "downward" movement relative to gravity.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, it may be useful to provide one or more SPDs for electrical installations. In some configurations, an SPD can be configured as a self-contained surge protection module (or SPD module), which can include a housing and surge protection circuits (or other equipment) contained by the housing. Further, in some configurations, surge protection modules (e.g., self-contained surge protection modules) can include a mounting apparatus that is configured to engage the surge protection module with a base, in order to physically secure the surge protection module to the base and to electrically connect the surge protection module to a relevant circuit within the base. In some configurations, multiple surge protection modules can be secured to a base, in order to provide surge protection for multiple circuits in a particular installation.

In conventional arrangements, mounting apparatuses for surge protection modules can engage relatively securely with associated bases. This can be useful, for example, in order to help to assure that the surge protection modules remain installed as appropriate for operation. Correspondingly, however, it can sometimes be relatively difficult to remove surge protection modules from a base, as may be necessary, for example, to replace or reconfigure the modules.

Embodiments of the invention can address this and other issues. For example, in some embodiments, an ejector can be configured to be engaged by users to assist in manually removing a surge protection module from a particular base. In some embodiments, an ejector can include an ejection body, such as a stand-alone lever or a component of a multi-member linkage or other assembly, which can be manually actuated in order to eject a surge protection module from a base. Usefully, some embodiments can provide a mechanical advantage that can significantly improve the ease with which users can remove surge protection modules from installed configurations. Further, some embodiments can be configured to help secure a surge protection module to a base as well as eject the module from the base.

In the examples discussed herein, reference is made to ejection of surge protection modules generally, and self-contained surge protection modules in particular. In some configurations, this may be a particularly beneficial use of embodiments of the invention. In some installations, however, embodiments of the invention can be used to eject other types of electric modules from associated bases.

FIG. 1 illustrates an example surge protection system 20, according to an embodiment of the invention. In the embodiment illustrated, the system 20 includes a base 22 that is configured to simultaneously receive multiple electric modules, such as a surge protection module 24. Generally, the base 22 can be configured to secure attached modules (e.g., the surge protection module 24) relative to a larger electrical system (not shown) and to electrically connect the modules to one or more circuits of the larger electrical system.

Figure 2:
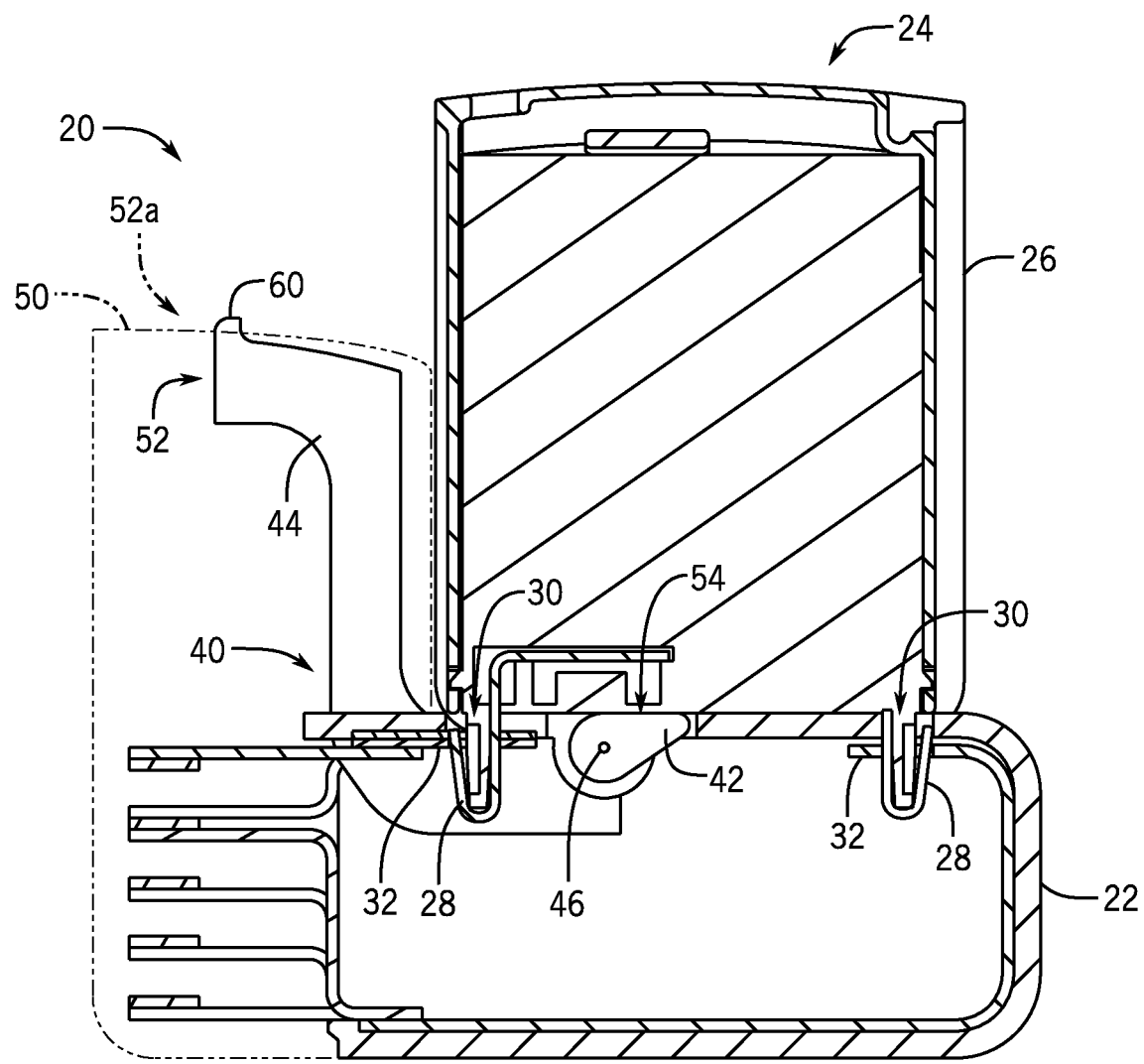
FIG. 2 is a sectional partial view of the surge protection system of FIG. 1, taken along plane 2-2 of FIG. 1.

As illustrated in FIG. 2 in particular, the surge protection module 24 includes a housing 26 to enclose and protect internal surge protection equipment, as well as a mounting apparatus that includes, in the illustrated example, relatively flexible conductive clips 28. The clips 28 are configured to be inserted into attachment openings 30 on the base 22 (see also FIG. 1) in order to secure the surge protection module 24 to the base 22, as well as to electrically connect the surge protection module 24 to conductive connections 32 within the base 22.

In other embodiments, other configurations of a mounting apparatus can be used to secure an electric module to a base. For example, in some embodiments, a mounting apparatus can be configured to engage a DIN rail or other standard attachment device on a base. Embodiments of the invention, including variations on the embodiment of FIG. 1, can be configured to eject modules that are secured with these and other mounting arrangements, in accordance with the general principles and specific examples discussed herein.

As illustrated in FIGS. 1 and 2, the base 22 also supports an ejector according to an embodiment of the invention. In the embodiment illustrated, the ejector is configured as an integral ejection body 40 disposed to operate as a lever to eject the surge protection module 24 from the base 22. As illustrated in FIG. 2 in particular, an internal end of the ejection body 40 includes an integrally formed cam 42 disposed to engage a bottom side of the surge protection module 24. Opposite the internal end, an external end of the ejection body 40 includes an engagement feature configured as an integrally formed actuation body 44, which is disposed to be manually (or otherwise) engaged to pivot the ejection body 40 relative to the base 22.

In the embodiment illustrated, the cam 42 and the ejection body 40 are configured to integrally pivot about a single pivot point 46. In other embodiments, however, other configurations are possible. For example, as also discussed below, some embodiments of the invention can include ejection bodies that form part of multi-member assemblies, which may include multiple points for pivoting or other relative movement, multi-piece linkages, or other arrangements.

As illustrated in FIG. 1 in particular, the base 22 includes multiple positions, as indicated by each paired set of two of the attachment openings 30, to receive multiple electric modules, including the surge protection module 24. Similarly, the base 22 includes multiple instances of the ejection body 40, as may be useful to individually eject the multiple electric modules. In some embodiments, the various ejection bodies 40 can be configured to be operate independently, in order to selectively eject only a selected number of attached modules. In some embodiments, as also discussed below, a single ejector can be configured to eject multiple modules.

Also as illustrated in FIG. 1 in particular, the base 22 includes a support body 50 for the ejection bodies 40. Generally, a support body can help to support relevant ejection bodies relative to other structures of a base. In some embodiments, a support body can also help to protect the ejection bodies against inadvertent actuation. For example, in the embodiment illustrated, the support body 50 defines a plurality of wells 52, each configured to receive a particular one of the ejection bodies 40. This arrangement can, for example, support the ejection bodies 40 relative to the larger base 22 as well as guide movement of the ejection bodies 40 during ejection of electric modules (as also discussed below). Further, in the embodiment illustrated, the wells 52 enclose the ejection bodies 40 on at least two sides, which can help to protect the ejection bodies 40 from being inadvertently actuated, such as by the impact of a falling object or by accidental contact by a user.

Figure 3:
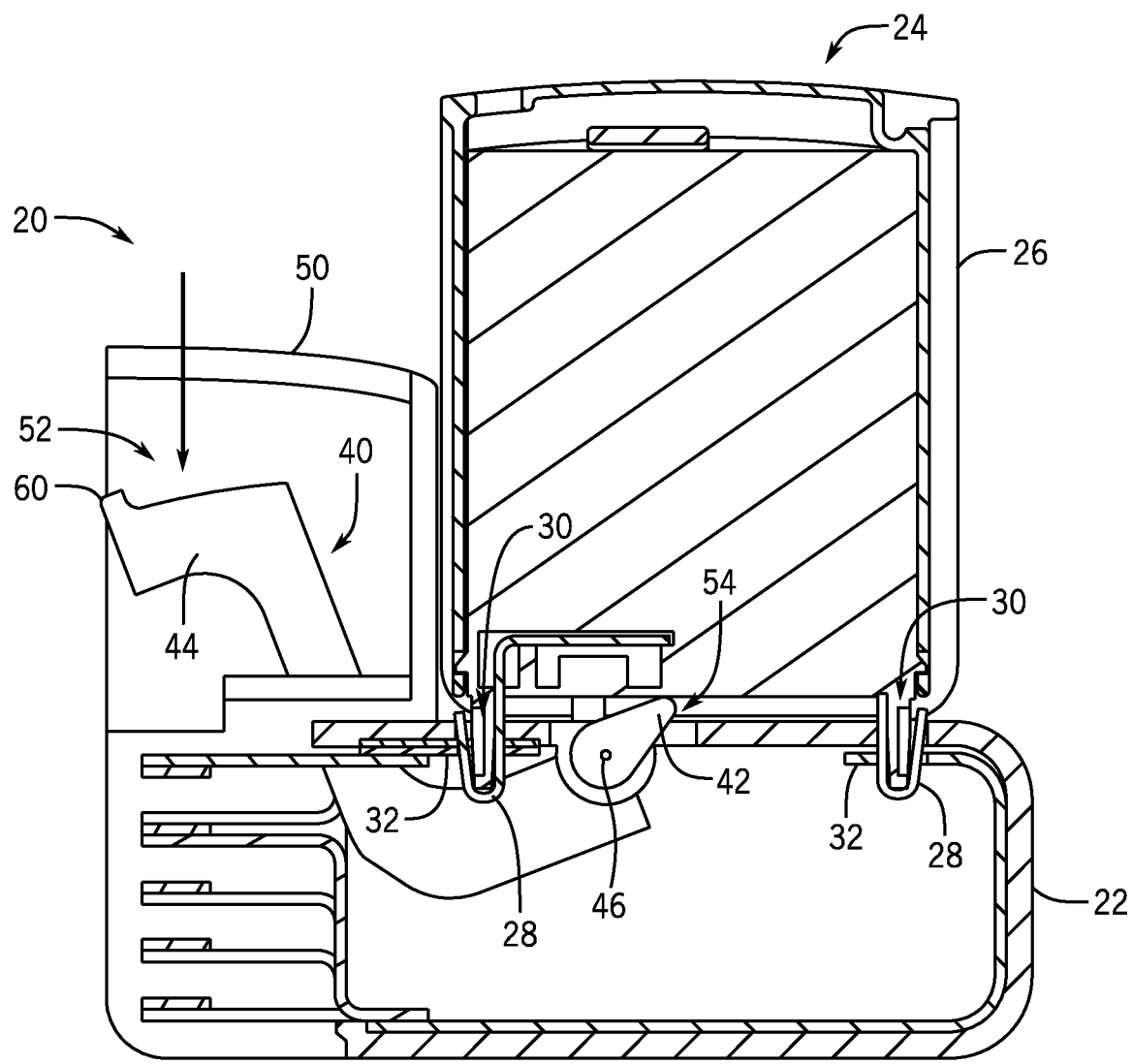
FIG. 3 is a sectional view of the surge protection system of FIG. 1, taken along plane 2-2 of FIG. 1, with one of the ejectors in an ejection configuration.

As illustrated in FIG. 3 in particular, in order to eject the surge protection module 24 from the base, a generally downward force (relative to the illustrated orientation) can be applied to the actuation body 44. As a result, the ejection body 44 can pivot about the pivot point 46 so that an extended end of the cam 42 is pivot into engagement with a lower surface of the surge protection module 24. With appropriate application of force, the cam 42 can be rotated sufficiently to disengage the clips 28 from the base 22, and the surge protection module 24 can then be fully removed from the base 22 (see, e.g., FIG. 4).

In some embodiments, the surge protection system 20 can be configured so that sufficient force to eject the surge protection module 24 can be applied manually, without the use of tools. For example, the ejection body 40 and the pivot point 46 can be configured to provide sufficient mechanical advantage to cause the cam 42 to eject the surge protection module 24 in response to a user using her fingers to press on the actuation body 44.

In some embodiments, an ejector according to the invention can be biased to return to a particular configuration in the absence of applied forces. For example, in some embodiments, the ejection body 40 can be engaged with a spring or other biasing element (not shown) in order to automatically return the ejection body 40 to the engaged orientation illustrated in FIGS. 1 and 2.

Figure 4:
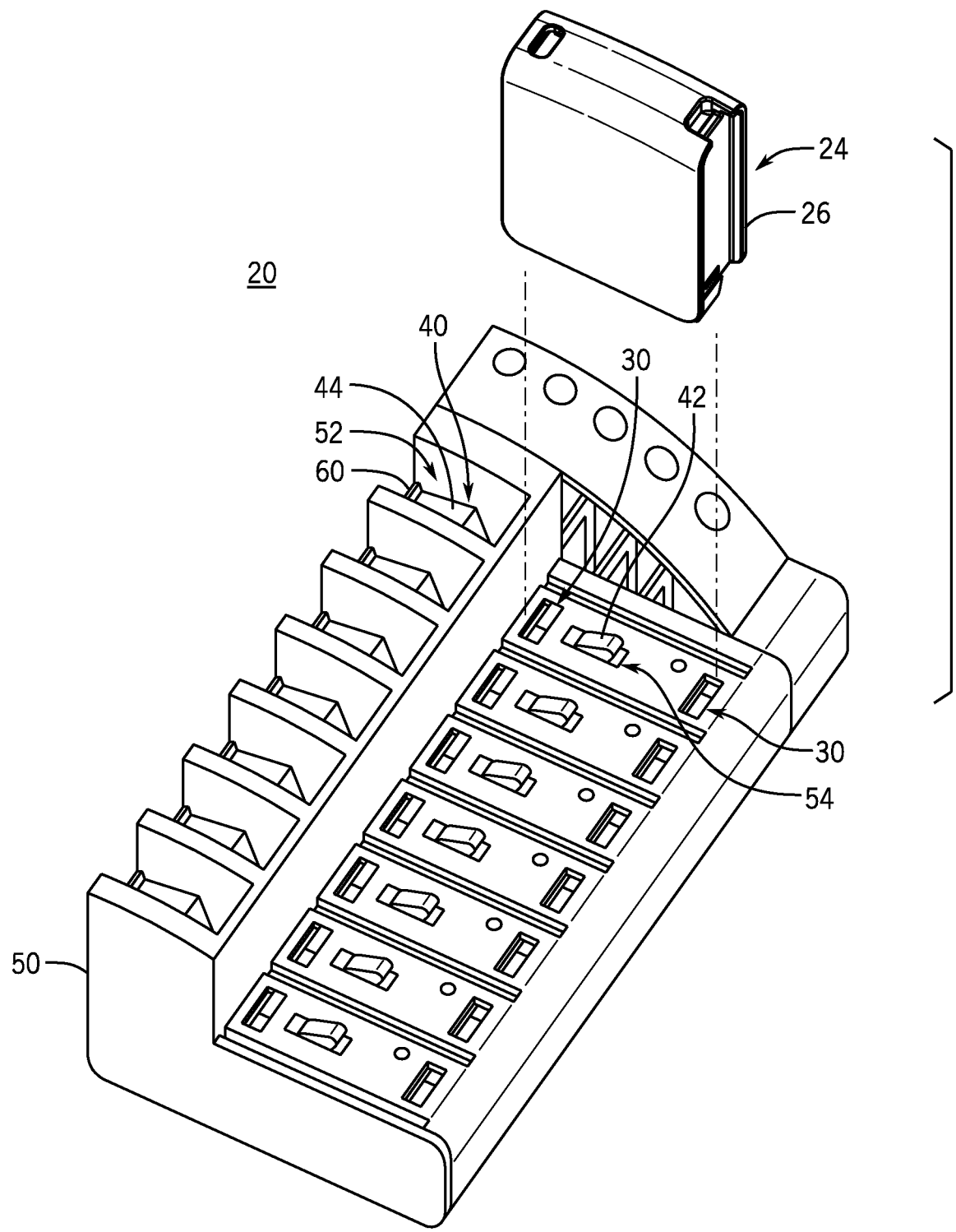
FIG. 4 is an isometric view of the surge protection system of FIG. 1, with the SPD module ejected from the base, and the ejectors in ejection configurations.

In some embodiments, an ejector can be configured to remain in a particular orientation until a module is engaged, or to not return to a particular orientation until a module is appropriately installed. As illustrated in FIG. 4, for example, when a module is not engaged with the base 22 at a particular location (e.g., at a particular pair of the openings 30), the ejection body 40 associated with that location is configured to remain in the ejection configuration. This can be useful, for example, in order to provide visual indicators to a user that a module is not installed. For example, the extension of the cams 42 through cam openings 54 in the base 22 and the disposition of the actuation bodies 44 relatively deeply within the wells 52 can visually indicate that corresponding modules are not appropriately attached.

In some embodiments, other indicators can be provided. For example, as illustrated in FIG. 2 in particular, when the surge protection module 24 is appropriately installed on the base, a reference feature, such as an integrally formed rigid flag 60 that extends from the actuation body 44, can extend clear of a top end 52a of the associated well 52. In this regard, in some embodiments, a user can verify appropriate installation of an electric module by checking the orientation of the flag 60 (or another reference feature) relative to the support body 50.

In some embodiments, a reference feature, such as the flag 60, can also provide an engagement feature for actuation of an ejection body. For example, the flag 60 can provide a convenient feature to engage a user's finger as the user presses the actuation body 44 into the well 52.

Figure 5:
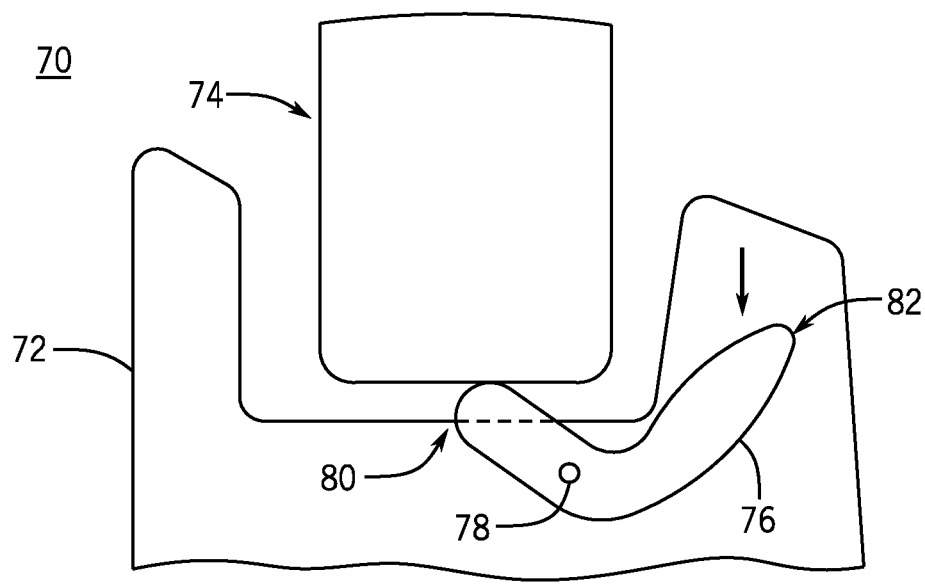
FIG. 5 is a schematic view of a surge protection system according to another embodiment of the invention, including a base, an ejector, and an SPD module.

In some embodiments, an ejection body may not include a cam, or a least may not include a cam disposed at a pivot point as illustrated for the cam 42 (see, e.g., FIG. 2). For example, as illustrated in FIG. 5, an electric system 70 according to an embodiment of the invention includes a base 72 that is configured to receive an electric module 74, and an ejection body 76 that is configured to eject the electric module 74 from the base 72. In particular, in the embodiment illustrated, the ejection body 76 is formed as an integral lever with a single pivot point 78 and a non-cammed contact end 80. As appropriate, a user can apply an ejection force downwardly onto an integrally formed engagement feature 82 of the ejection body 76, in order to pivot the ejection body 76 about the pivot point 78. The pivoting of the ejection body 76 can then cause the contact end 80 to be urged against the electric module 74, to eject the electric module 74 from the base 72.

Figure 6:
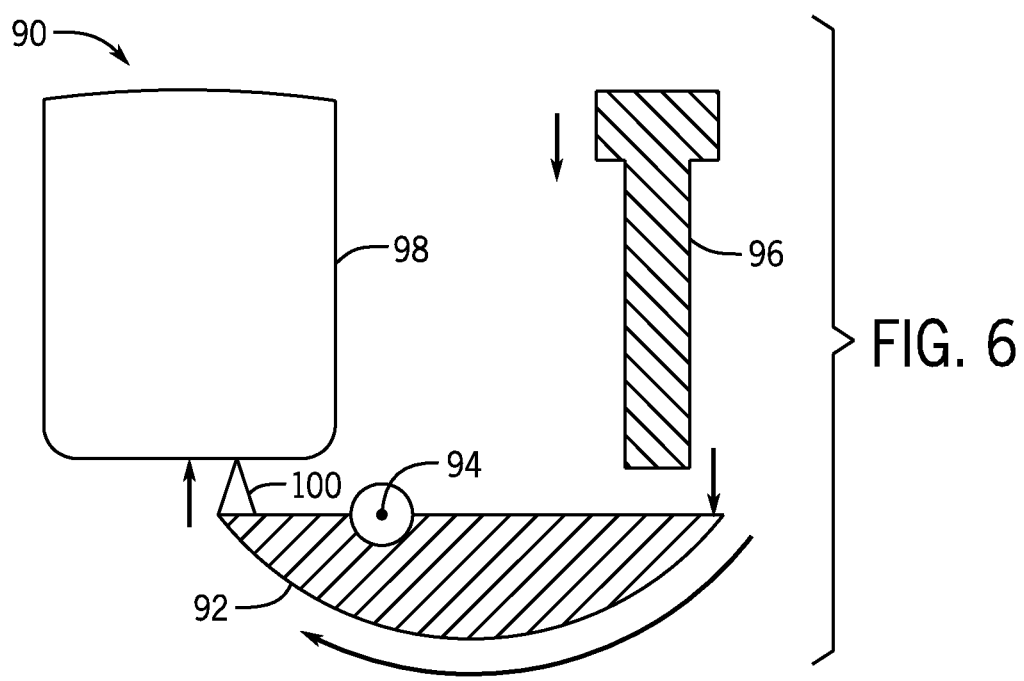
FIG. 6 is a schematic view of a surge protection system according to still another embodiment of the invention, including a base, an ejector, and an SPD module.

In some embodiments, as also noted above, an ejection body can be formed from multiple pieces or can be part of a multi-member assembly. For example, as illustrated in FIG. 6, a surge protection system 90 according to an embodiment of the invention includes an ejector with an ejection body configured as a lever 92 that is arranged to pivot about a pivot point 94. A separate actuation body of the ejector is configured as a push member 96 disposed to contact a first end of the lever 92. With this arrangement, for example, a user can eject a surge protection module 98 from a base (not shown) by pushing downward on the push member 96 to cause the push member 96 to bear downward on the first end of the lever 92. This, in turn, can cause the lever 92 to pivot about the pivot point 94 and thereby urge a contact ejection feature 100 into the bottom of the surge protection module 98 to eject the surge protection module 98 from the base.

In some embodiments, the ejector of the surge protection system 90 can be configured to automatically return to an engaged configuration after a module has been ejected. For example, a biasing member (not shown) can be provided to bias the lever 92 or the push member 96 to the configuration illustrated in FIG. 6. In some embodiments, the ejector can be configured to remain in an ejection configuration (not shown) until an electric module is appropriately secured relative to the ejector. As similarly discussed above for the surge protection system 20, for example, this can provide a visual (or other) indicator to a user that an electric module has not been appropriately attached to the system 90 at a position associated with the lever 92.

In some embodiments, a lever of an ejector can be configured to engage an electric module in other ways. For example, in some embodiments, the lever 92 can be modified to include a cam (not shown) similar to the cam 42 (see, e.g., FIG. 2), so that the lever 92 can effect a cammed engagement with an electric module to eject the electric module from the system 90.

Figure 7A:
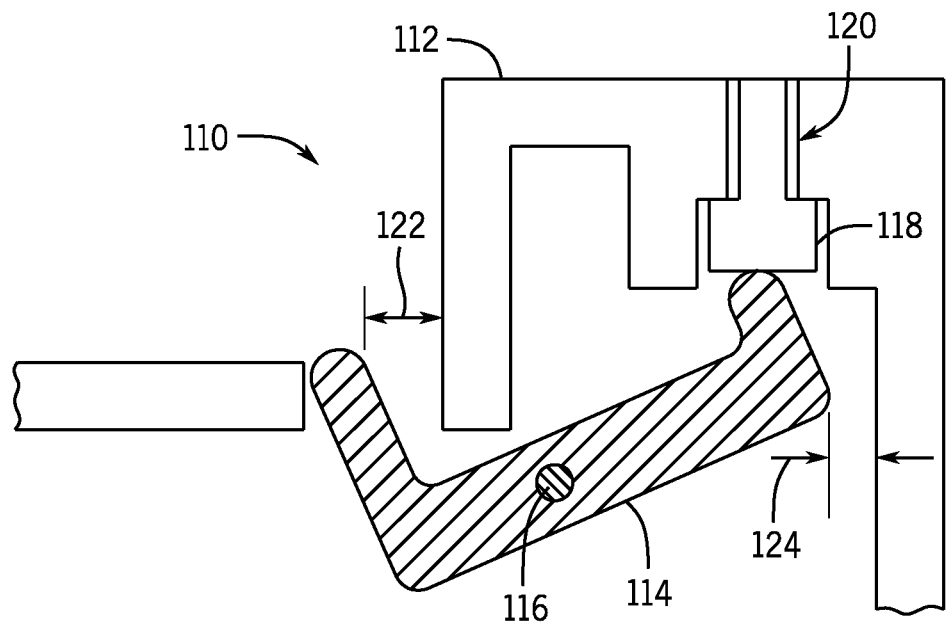
FIG. 7A is a schematic view of a surge protection system according to yet another embodiment of the invention, including a base, an ejector, and an SPD module.
Figure 7B:
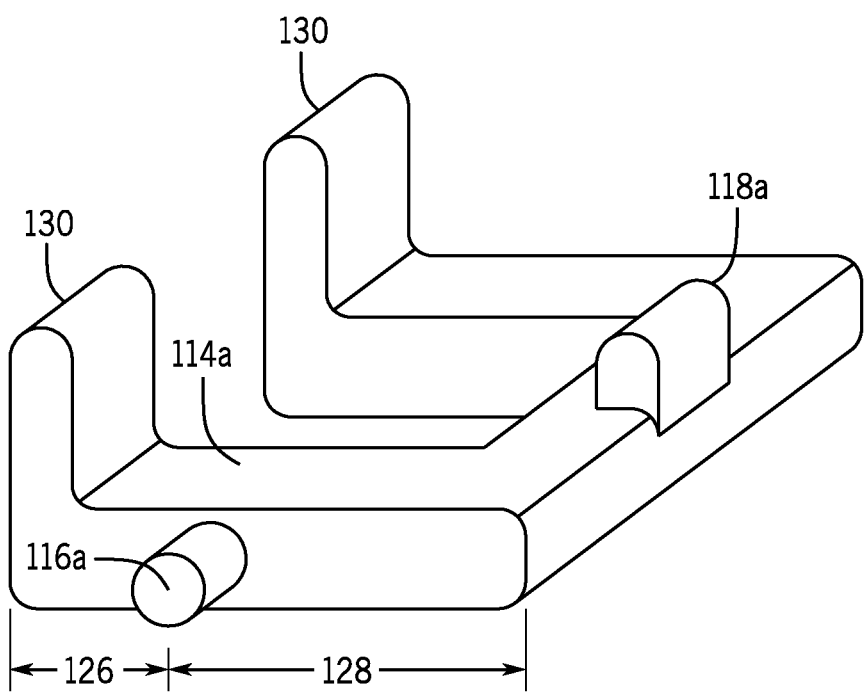
FIG. 7B is an isometric view of an example configuration of the ejector of FIG. 7A.

FIGS. 7A and 7B illustrate a surge protection system 110 according to another embodiment of the invention. The surge protection system 110 is generally similar to the surge protection system 90 (see FIG. 6), with a base 112 that is configured to receive a surge protection module (not shown), and an ejector that includes a lever 114 and a push member 118. The lever 114 is configured to pivot about a pivot point 116 to eject the module and the push member 118 configured to be pressed by a user to actuate the lever 114.

In the embodiment illustrated, similarly to the surge protection system 20 (see FIGS. 1 through 4), the push member 118 is configured to provide a visual indicator of proper installation of a surge protection module. In particular, the push member 118 is nested within a well 120 on the base 112. When a surge protection module is installed on the base 112, the module can pivot the lever 114 to move the push member 118 upward within the well 120, so that the top end of the push member 118 is substantially aligned with (or otherwise predictably oriented relative to) a top end of the well 120. In contrast, before the surge protection module is installed, the push member 118 can be disposed relatively lower within the well 120, so that the top end of the push member 118 is somewhat hidden from sight. Accordingly, a user may be able to visually verify, based on the location of the push member 118, whether an associated module is appropriately installed.

In some embodiments, appropriate clearance can be provided between moving parts of an ejector and features of a base, in order to permit appropriate operation of the ejector. As illustrated in FIG. 7A in particular, for example, appropriately scaled gaps 122, 124 can be provided between the lever 114 and walls of the base 112 so that the lever 114 can appropriately pivot to eject a module from the base 112.

In some embodiments, as also noted above, an ejector can provide a relatively substantial mechanical advantage to assist in ejecting a module from a base. For example, as illustrated in FIG. 7B in particular, a spacing 126 between a pivot point 116a and an ejection end of a lever 114a can be one half (or another fraction) of a spacing 128 between the pivot point 116a and an actuation end of the lever 114a.

In some embodiments, ejectors according to the invention can include multiple contact features to assist in ejecting modules from a base. For example, in some embodiments, as illustrated in FIG. 7B, the lever 114a can include or be otherwise associated with multiple contact arms 130. In some embodiments, when a push member 118a is actuated, each of the contact arms 130 can be disposed to contact a particular surge protection module (not shown in FIG. 7B) to eject the module from the relevant base. In some embodiments, each of the contact arms 130 can be disposed to contact a different surge protection module.

Figure 8:
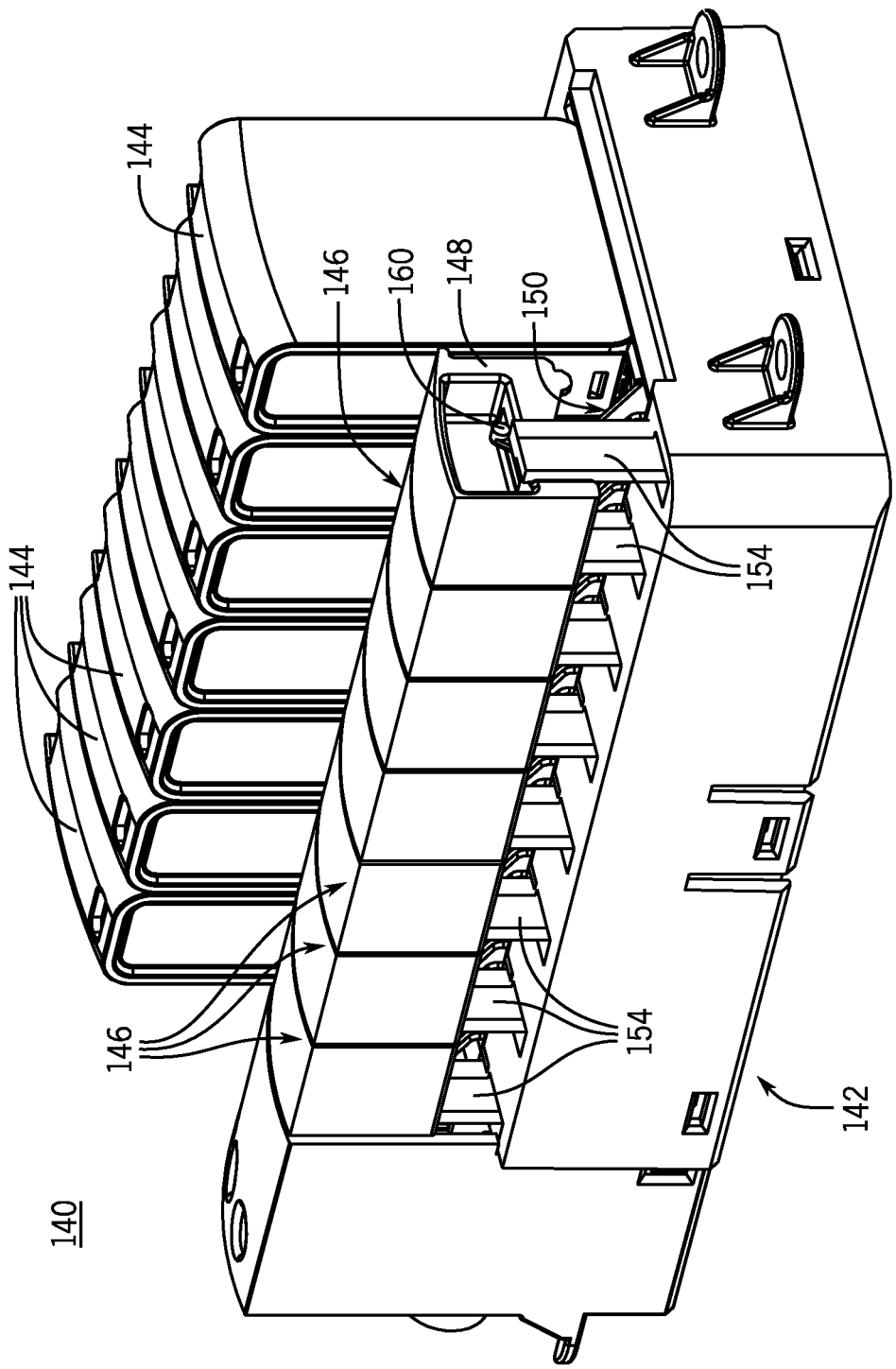
FIG. 8 is an isometric view of a surge protection system according to an embodiment of the invention, including a base, multiple ejectors in engaged configurations, and an SPD module installed for operation.

FIG. 8 illustrates another example surge protection system 140 according to another embodiment of the invention. In the embodiment illustrated, the surge protection system 140 includes a base 142 that is configured to simultaneously receive multiple electric modules, such as surge protection modules 144. Generally, the base 142 can be configured to secure attached modules (e.g., the surge protection modules 144) to a larger electrical system (not shown) and to electrically connect the modules to one or more circuits of the larger electrical system, similarly to the base 22 (see, e.g., FIG. 1). In the embodiment illustrated, the surge protection modules 144 are configured similarly to the modules 24 (see FIG. 2), although other configurations are possible.

The system 140 also includes an assembly of push-button ejectors 146, which are configured to be used to selectively manually eject one or more of the modules 144 from the base 142. Generally, the push-button ejectors 146 operate similarly to the ejectors illustrated in FIGS. 6 and 7A. For example, each of the ejectors 146 includes a push member 148 that is slidably supported relative to the base 142, and a lever 150 (see also FIGS. 9 and 10) that is pivotably secured to the base 142. When pushed (e.g. manually) towards the base 142, each of the push members 148 causes the associated lever 150 to pivot, so that an end of the lever 150 is urged towards the associated surge protection module 144. With sufficient movement of the push members 148, and corresponding rotation of the levers 150, the surge protection modules 144 can thus be selectively ejected from the base 142.

Figure 9:
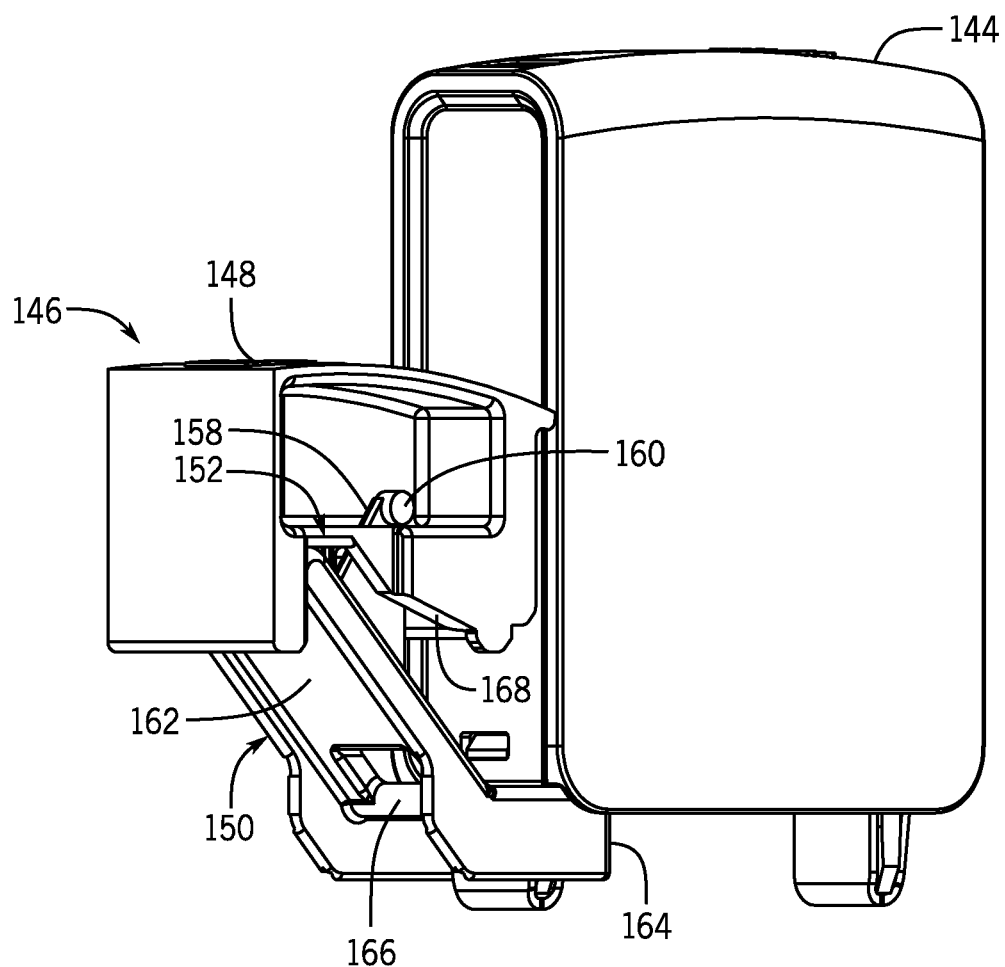
FIGS. 9 and 10 are isometric views of certain components of the surge protection system of FIG. 8, including an ejector, in assembled and exploded configurations, respectively.
Figure 10:
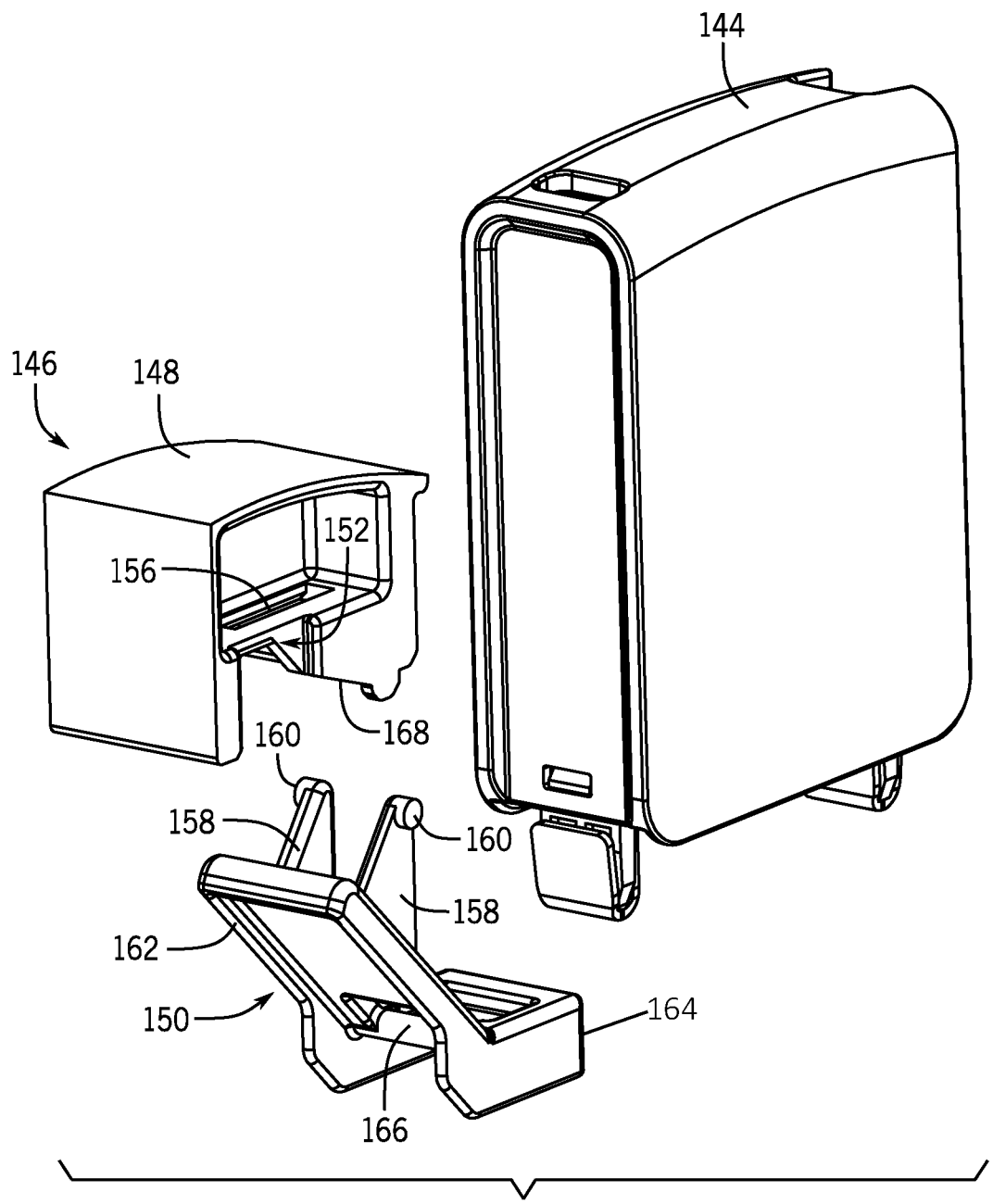

The ejectors 146 also differ from the ejectors of FIGS. 6 and 7A in some aspects. As illustrated in FIGS. 9 and 10 in particular, each of the push members 148 is configured with a set of laterally opposed guide recesses 152 (only one shown) that are configured to slide along support members 154 of the base 142 (see FIG. 8). Thus, the support members 154 can generally constrain the push members 148 to prescribed (e.g., linear) movement towards and away from the base 142. In some embodiments, the push members 148 can be biased away from the base 142, as similarly discussed for other embodiments above.

Each of the push members also includes a set of laterally opposed slots 156 that slidably receive associated tabs 158 of the lever 150. At free ends thereof, each of the tabs 158 includes a laterally outwardly extending pin 160 that can help to secure the tabs 158 within the associated slots 156.

In addition to the tabs 158, the lever 150 is formed to integrally include an angled actuation portion 162 from which the tabs 158 extend, a contact (ejection) portion 164, and a pivot rod 166. The pivot rod 166 is pivotally secured to the base 142, so that the contact portion 164 of the lever 150 extends beneath the associated module 144, when the module 144 is secured to the base 142.

Generally, the contact portion 164 can be configured to be recessed below a contact surface of the base 142 when the lever 150 is in an engaged orientation (see FIG. 8), so that the contact portion 164 does not interfere with secure attachment of the associated module 144 to the base 142. However, when the push member 148 is pushed towards the base 142, contact between an angled lower wall 168 of the push member 148 and the actuation portion 162 of the lever 150 can cause the lever 150 to pivot relative to the base, about the pivot rod 166. Thus, the lever 150 can be pivoted to urge the contact portion 164 of the lever 150 into the associated module 144 and thereby eject the module 144 from the base 142.

In some embodiments, it may be useful to provide ejectors that include integrally formed levers, pivotally secured to a relevant base. This may be useful, for example, in order to simplify manufacturing and operation, as well as to provide for substantial durability. Further, as with other embodiments discussed above, there may be particular benefits to securing an ejector directly to a base, without the ejector being attached to and removable with the relevant surge protection (or other) module. For example, an ejector that is secured to a base rather than to a module can allow a variety of conventional modules to be interchangeably used with the base, without requiring an ejector to be separately formed for, and attached to, each of the modules. In some cases, this benefit can be particularly notable if the ejector remains secured to the base even as an associated module is ejected from the base.

Figure 11:
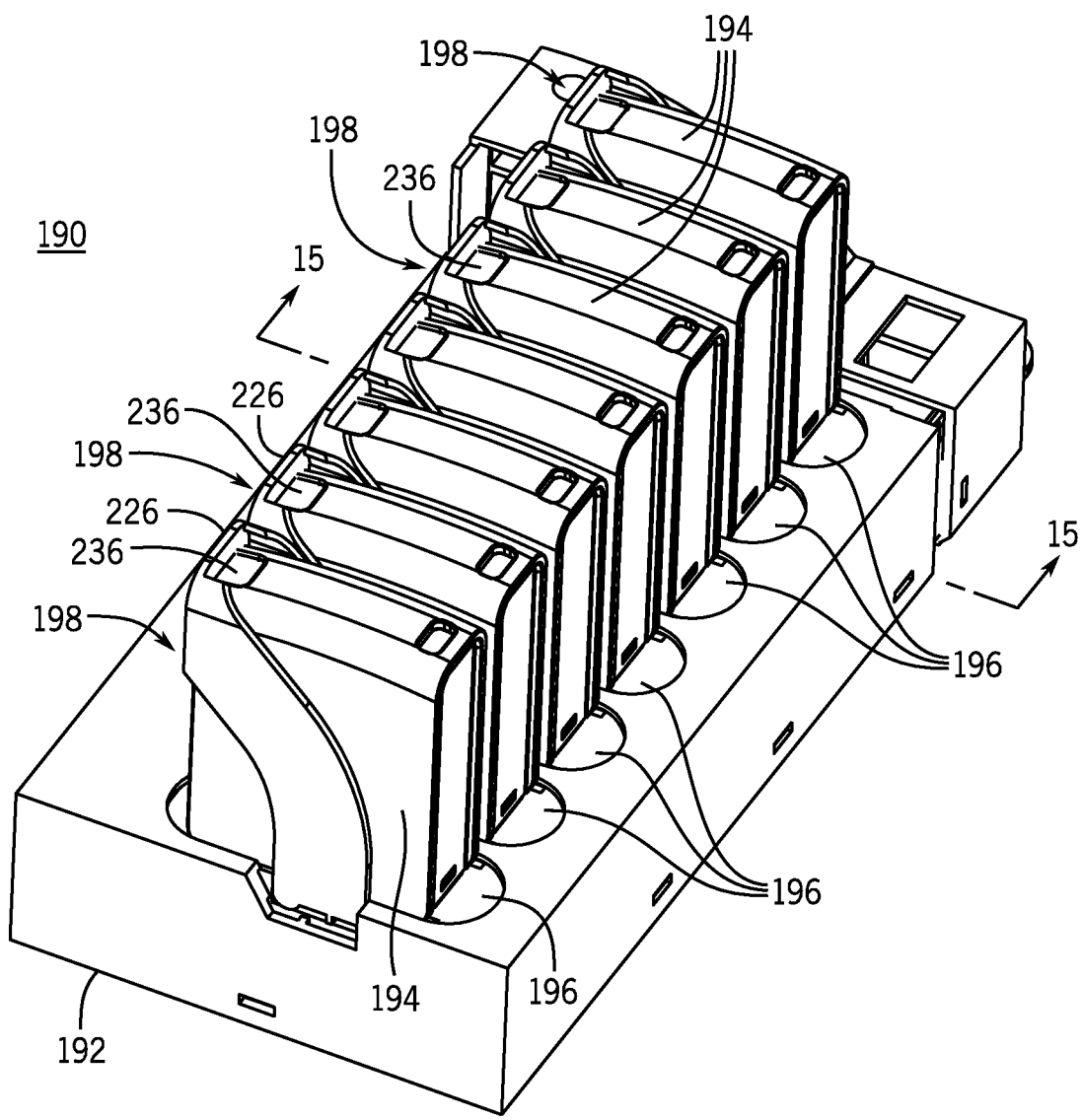
FIG. 11 is an isometric view of a surge protection system according to an embodiment of the invention, including a base, multiple ejectors in engaged configurations, and multiple SPD modules installed for operation.

Consistent with these principles, FIG. 11 illustrates an example surge protection system 190, according to an embodiment of the invention. In the embodiment illustrated, the system 190 includes a base 192 that is configured to simultaneously receive multiple electric modules, such as surge protection modules 194. Generally, the base 192 can be configured to secure attached modules (e.g., the surge protection modules 194) to a larger electrical system (not shown) and to electrically connect the modules to one or more circuits of the larger electrical system.

In the illustrated embodiment, the surge protection modules 194 are configured similarly to the module 24 (see FIG. 2), with an insulating body and flexible conductive clips 210 for attachment to the base 192. In other embodiments, however, other configurations are possible.

To provide for temporary, ejectable attachment of modules, the base 192 includes a plurality of engagement blocks 196, each of which is configured to support an associated ejector lever 198 and an associated one of the surge protection modules 194. In the embodiment illustrated, each of the engagement blocks 196 are configured to be substantially identical to each other, as are the ejector levers 198. This may be useful, for example, to provide for easy operation with a standardized, modular configuration for the surge protection modules 194. In other configurations, however, different engagement blocks and ejectors can be used with a particular base.

As illustrated in particular in FIGS. 12 through 14B, an example one of the engagement blocks 196 is formed as a single-piece, generally rectangular body, which can be secured within the base 192 with a support surface 200 disposed to receive one of the surge protection modules 194. A set of lever recesses 202 are provided on opposite lateral sides of the engagement block 196, each sized to receive a part of the corresponding ejector lever 198, as also discussed below. Pivot openings 204 (only one shown) are also provided, within the lever recesses 202, to pivotably engage corresponding pins 206 on the ejector lever 198. This arrangement may allow for simple and reliable pivotable attachment of the ejector lever 198 to the base 192, via the engagement block 196, while also allowing for only the ejector lever 198 to be replaced in the event, for example, that one of the pins 206 is broken. In other embodiments, however, other configurations are possible, including configurations with other pivoting arrangements. For example, in some embodiments, pins may be provided on a base (e.g., as part of an engagement block) and corresponding pivot openings can be provided on a lever or other ejector body.

In some embodiments, other features can be provided to help secure a module to a base. In the illustrated embodiment, for example, the engagement block 196 includes a set of clip recesses 208 that are configured to releasably engage the clips 210 on the surge protection module 194 (e.g., similarly to the attachment openings 30 of FIG. 1). Similarly, the engagement block 196 also includes an additional set of recesses, formed as elongate slots 212 that extend in alignment with the lever recesses 202. As also discussed below, the slots 212 can be configured to receive parts of the surge protection module 194 to help provide a secure engagement the module 194.

Figure 12:
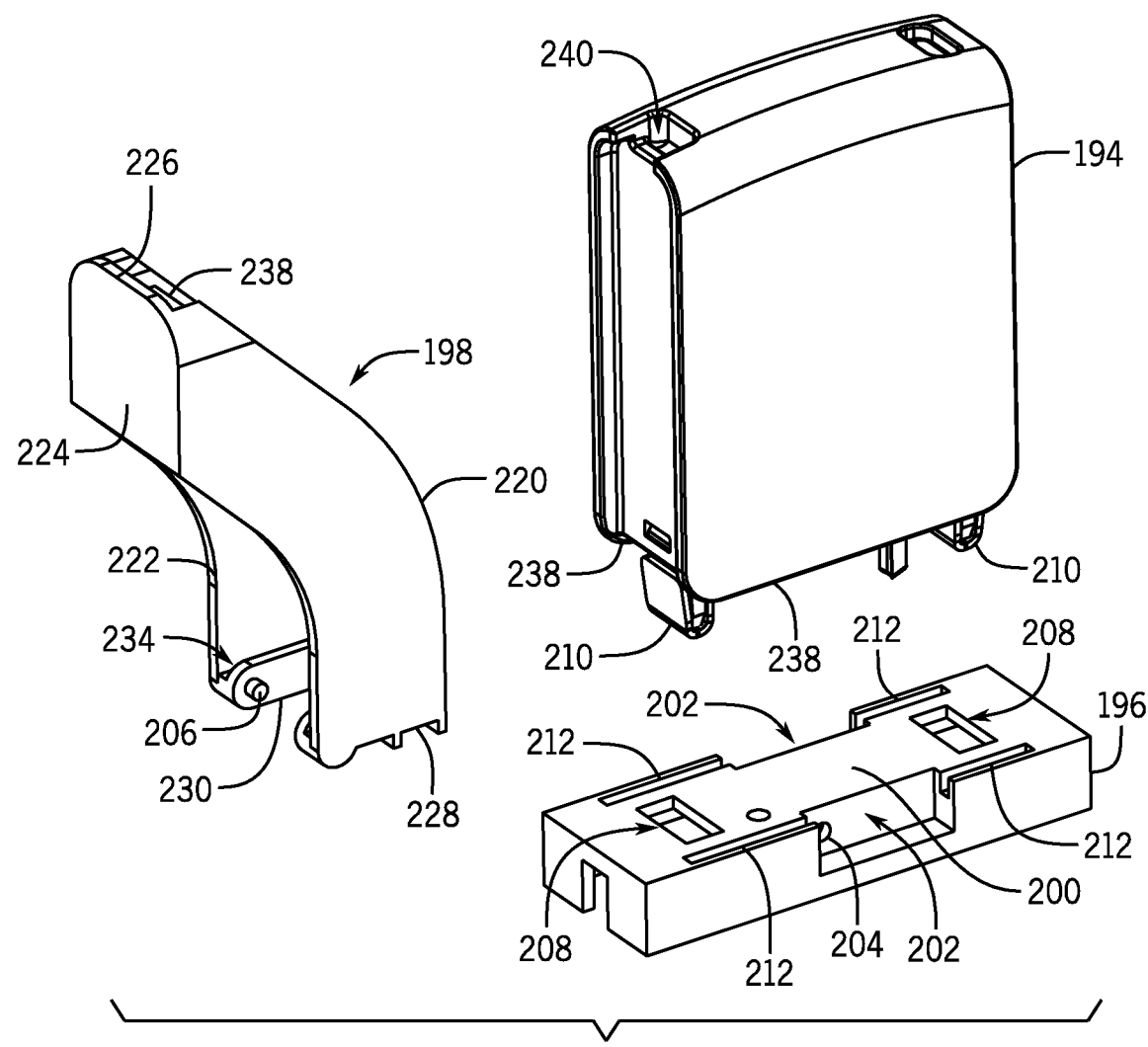
FIGS. 12 and 13 are isometric exploded views of certain components of the surge protection system of FIG. 11, including an engagement block, an ejector lever, and an SPD module.

As alluded to above, in the embodiment illustrated in FIGS. 11 through 14B, the base 192 supports a number of the ejector levers 198, each formed as single-piece (e.g., integrally formed) ejection body that is pivotably secured to the base at pivot points defined by the pins 206 and the pivot openings 204 (see, e.g., FIG. 12). Generally, each of the ejector levers 198 is configured to be manually pivoted in order to eject a corresponding one of the surge protection modules 194 from the base 192.

Figure 13:
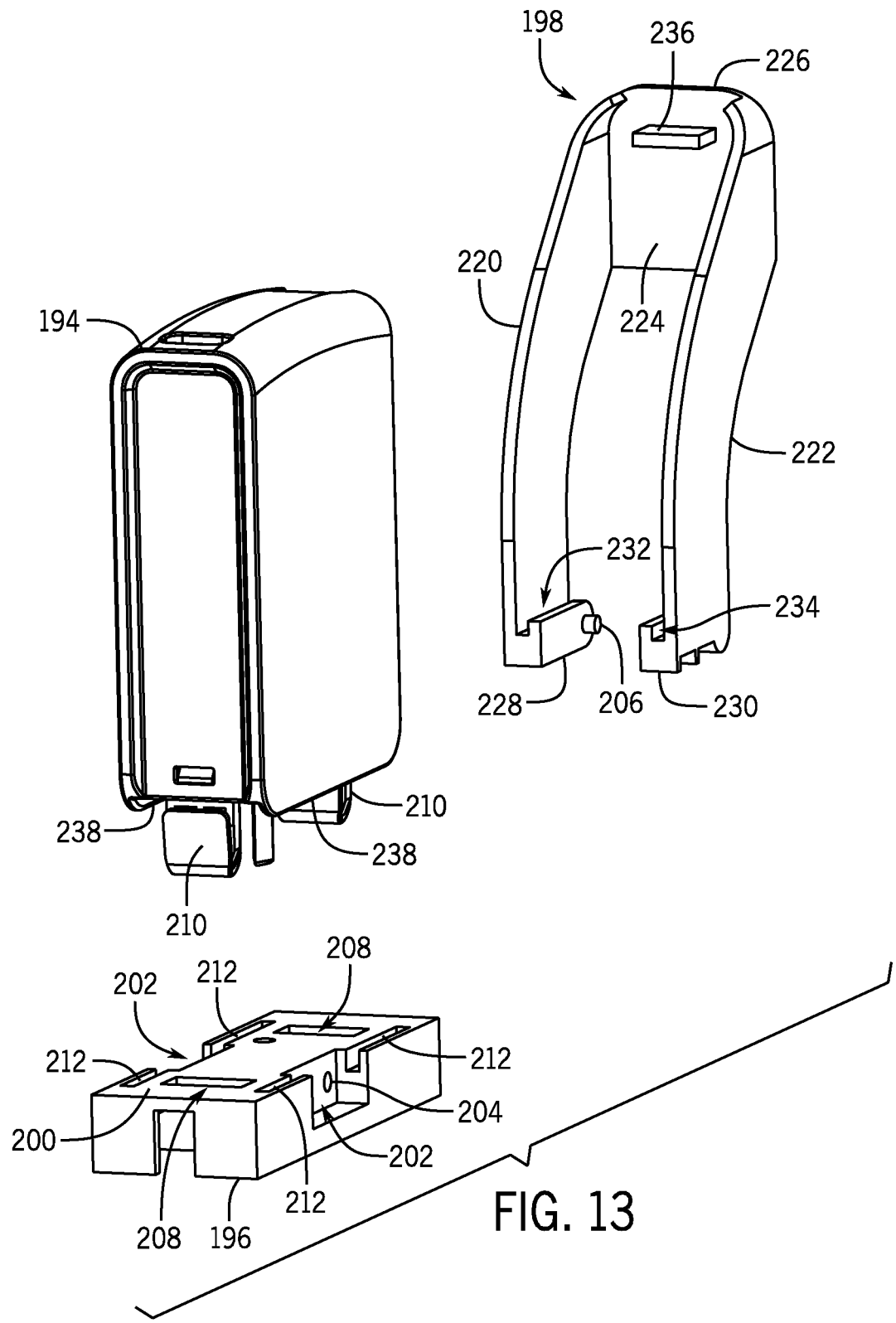
Figure 15:
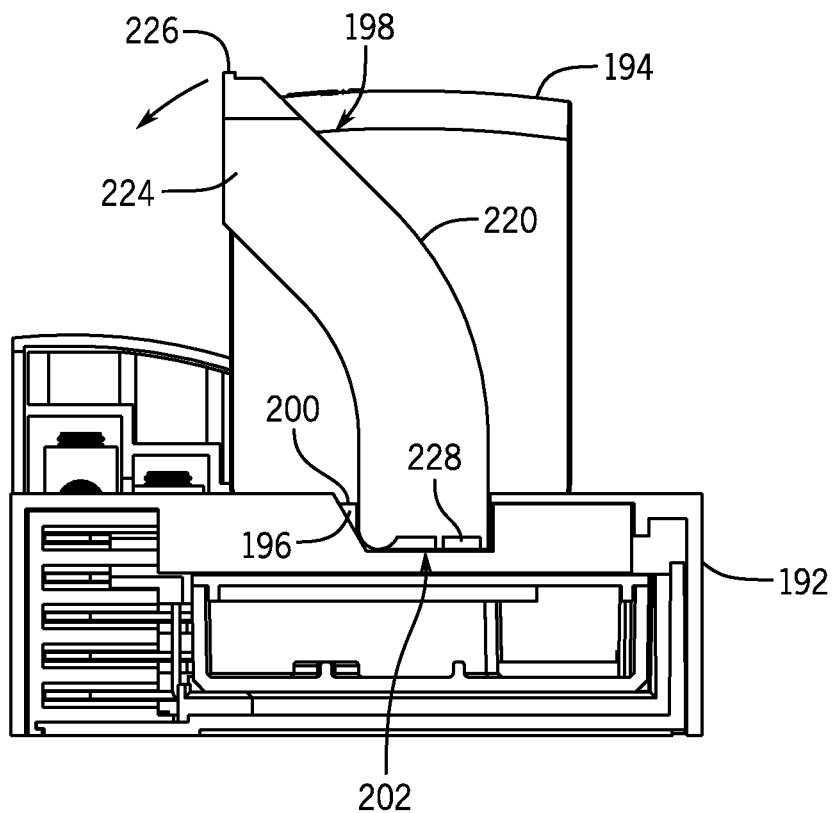
FIGS. 15 and 16 are isometric sectional partial views of the surge protection system of FIG. 11, with the illustrated ejector in the engaged configuration.
Figure 16:
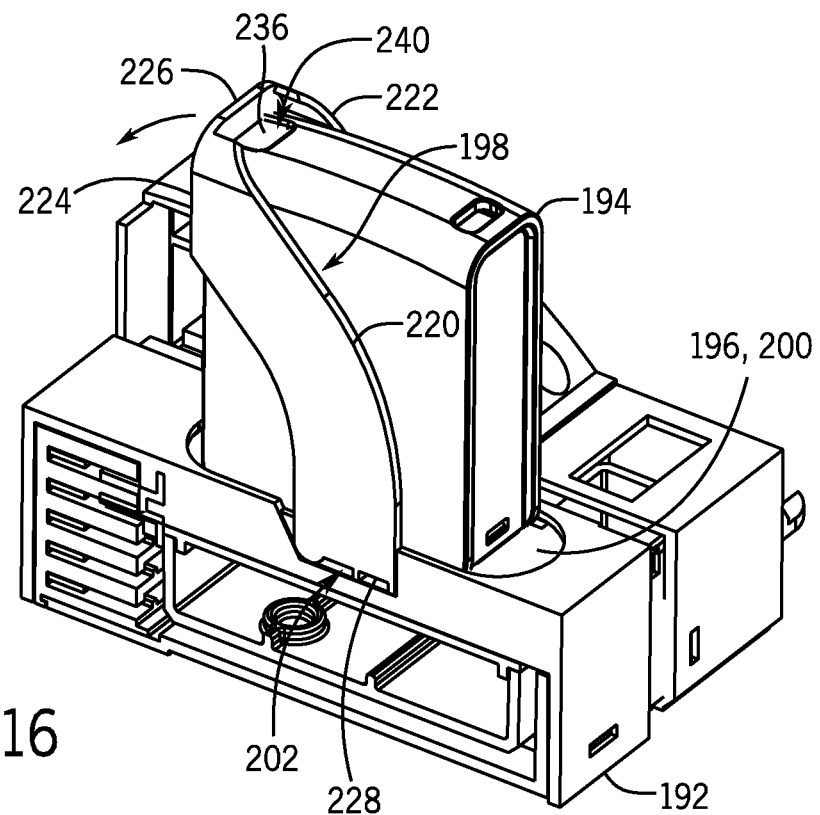

In different embodiments, a single-piece ejector lever can be configured in a variety of ways. As illustrated in FIGS. 12 and 13 in particular, for example, an example one of the ejector levers 198 includes first and second legs 220, 222 that are connected by a linking section 224 that extends between the legs 220, 222 at an opposite end of the ejector lever 198 from the pins 206. To facilitate easy operation by users, the linking section 224 of the illustrated embodiment also includes a manual-engagement feature configured as a rounded, slightly protruding tab 226 that can be manually engaged to pivot the ejector lever 198 about the pins 206.

In the illustrated embodiment, the pins 206 are formed as separate protrusions from the respective legs 220, 222 with a lateral spacing therebetween. This may be useful, for example, in order to allow for easy initial installation of the ejector lever 198 onto the engagement block 196 as well as easy replacement of the ejector lever 198, without substantial disassembly of the base 192, as may be necessary in the event of accidental breakage. In other embodiments, however, other configurations are possible, including configurations with a single pivot pin or other pivoting arrangement.

Also in the embodiment illustrated, each of the legs 220, 222 supports a respective ejection feature, configured as (contact) ejection arms 228, 230 that extend from the legs 220, 222 laterally towards each other. Each of the ejection arms 228, 230 supports a respective one of the pins 206 and, as illustrated in FIGS. 14A and 14B in particular, is generally configured to nest completely within an associated one of the lever recesses 202 when the ejector lever 198 is pivotably engaged with the engagement block 196. Thus, for example, as illustrated in FIG. 14B in particular, the ejection arms 228, 230 can be recessed fully below the support surface 200 of the engagement block 196 when the ejector lever 198 is in an engaged orientation, so that the surge protection module 194 can be flushly seated on the support surface 200. Each of the ejection arms 228, 230 also defines a respective ejector recess 232, 234 that is configured to be substantially aligned with the slots 212 when the ejector lever 198 is in an engaged orientation.

In some embodiments, an ejector body can also support features that can help to secure a surge protection module to a base. For example, as illustrated in FIGS. 13 and 14A in particular, a locking tab 236 extends from the linking section 224, between the first and second legs 220, 222, on an opposite end of the ejector lever 198 from the pins 206. As also discussed below, the locking tab 236 can engage a corresponding locking feature on a surge protection module, when the ejector lever 198 is in the engaged orientation (e.g., as in FIG. 11) to further secure the module in a desired orientation.

With reference in particular to FIGS. 11 and 14B, the surge protection module 194 can be secured to the engagement block 196 with the clips 210 extending into engagement with the clip recesses (see, e.g., FIG. 12) and with a bottom surface of the body of the surge protection module 194 seated on the support surface 200 of the engagement block 196. As also noted above, in this arrangement, the ejector lever 198 is disposed in an engaged orientation, with the ejection arms 228, 230 recessed fully within the lever recesses 202 of the engagement block 196 and the ejector recesses 232, 234 aligned, along an elongate direction, with the slots 212 on the engagement block 196. Accordingly, not only are the ejection arms 228, 230 disposed so as not to interfere with the surge protection module 194, but opposing rails 238 on the surge protection module 194 can extend simultaneously into the slots 212 and into the ejector recesses 232, 234. This can provide further stability for the engagement between the surge protection module 194, the base 192, and the ejector lever 198, and also help to appropriately align the surge protection module 194 during installation.

Also with the surge protection module 194 thus installed, the legs 220, 222 of the ejector lever 198 extend upwardly (from the illustrated example perspective) along a central portion of opposing lateral sides of the surge protection module 194, then curve toward the linking section 224. The linking section 224, in turn, extends across a third side of the surge protection module 194, between the sides of the surge protection module 194 along which the legs 220, 222 extend. In some arrangements, this geometry can ensure that users can easily provide appropriate leverage at the tab 226 to pivot the ejector lever 198 and eject the surge protection module 194. Similarly, this configuration can also help to avoid accidental ejection of the surge protection module 194. For example, as well as providing useful leverage, the illustrated extension of the legs 220, 222 and the linking section 224 along three adjacent sides of the surge protection module 194 can help to prevent the surge protection module 194 from being inadvertently dislodged from its desired functional orientation relative to the base 192 (see FIG. 11). Further, the extension of the linking section 224 alongside the surge protection module 194 can dispose the locking tab 236 in alignment to extend into a corresponding locking recess 240 on the surge protection module 194. This the locking tab 236 can readily engage the locking recess 240 to help to further secure the surge protection module 194 against inadvertent removal from the base 192.

With the surge protection system 190 thus arranged, the ejector levers 198 can be readily, manually operated to eject one or more of the surge protection modules 194, as appropriate. As illustrated in FIGS. 15 through 18, for example, a user (not shown) can manually engage the tab 226, or another relevant feature, in order to rotate the ejector lever 198 relative to the base 192. As the ejector lever 198 rotates, the ejection arms 228, 230 are lifted out of the lever recesses 202 (see, e.g., FIGS. 17 and 18) to urge the surge protection module 194 away from the base 192. With appropriate application of force to the ejector lever 198, a user can thus manually, but indirectly, remove the clips 210 from the clip recesses 208 and thereby fully eject the surge protection module 194 from the base 192.

Figure 17:
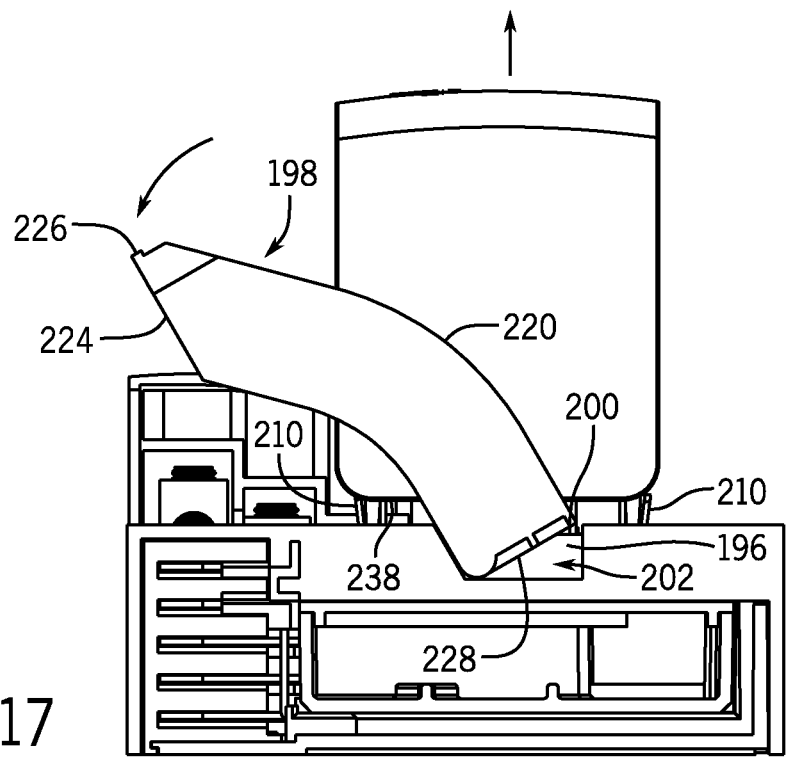
FIGS. 17 and 18 are isometric sectional partial views of the surge protection system of FIG. 11, with the illustrated ejector in the ejection configuration.
Figure 18:
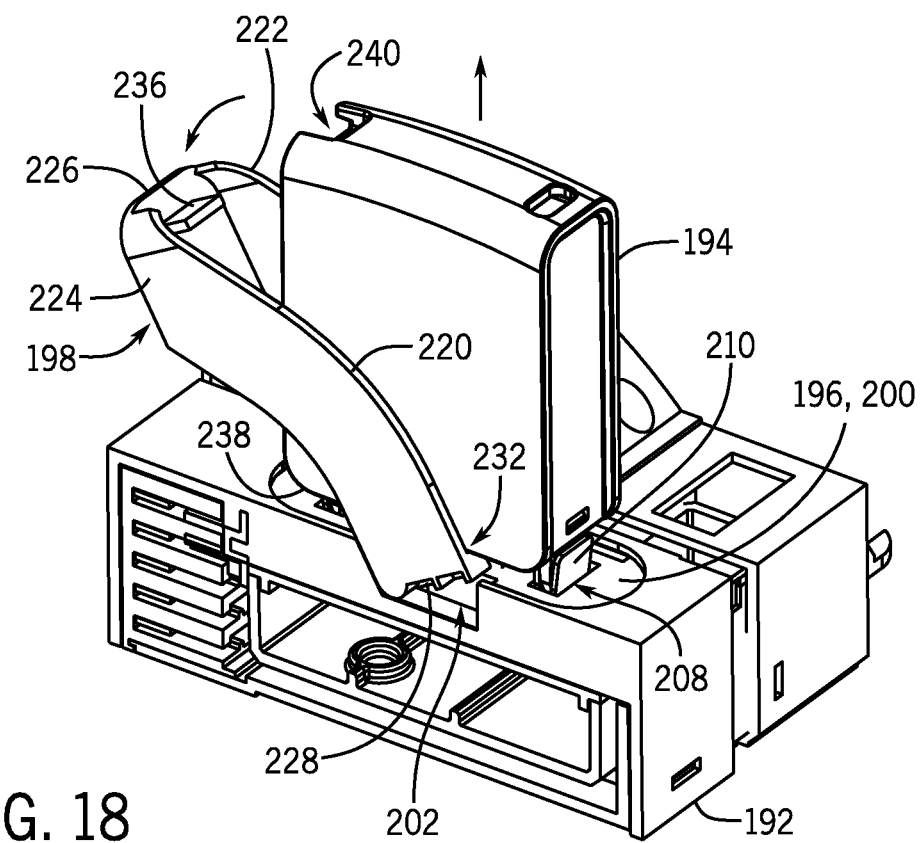

In some embodiments, certain features discussed above (for this or other embodiments) can provide additional benefits. For example, as illustrated in FIGS. 17 and 18 in particular, as the ejection arms 228, 230 lift the surge protection module 194 off of the base 192, the legs 220, 222 continue to extend along opposing sides of the surge protection module 194. As one associated benefit, for example, this can help to hold the surge protection module 194 to be easily manually accessible by a user. Similarly, the rails 238 also remain engaged with the ejector recesses 232, 234 on the ejection arms 228, 230. This can also help to maintain the surge protection module 194 in a readily accessible orientation for retrieval by a user, including by helping to prevent the surge protection module 194 from falling off of the ejector lever 198 and off of the base 192 at large.

In some embodiments, installation of a surge protection module can automatically reset an ejector to an engaged configuration so that the ejector can be used, as needed, to eject the surge protection module. For example, considering operations in reverse to those illustrated in FIGS. 15 through 18 (sequentially), as the surge protection module 194 is installed onto the base 192, the rails 238 can engage the ejection arms 228, 230 to rotate the ejector lever 198 from an ejection orientation (e.g., as in FIGS. 17 and 18) to an engaged orientation (e.g., as in FIGS. 15 and 16). Accordingly, installation of the surge protection module 194 can automatically move the ejector lever 198 to help secure the surge protection module 194 via the locking tab 236, the first and second legs 220, 222, and the linking section 224, as well as orienting the ejector lever 198 to eject the surge protection module 194, as needed. Further, engagement of the rails 238 by the ejector recesses 232, 234 can help to appropriately orient the surge protection module 194 for easier installation.

In other embodiments, other configurations are possible. For example, as also noted above, in some embodiments, ejector bodies can be included in multi-member assemblies. In some embodiments, an ejector body can form part of a multi-member linkage. For example, referring again to FIG. 6, in some embodiments, an ejector can include features that are generally similar to the lever 92 and push member 96, but that are linked together by shared pivots, sliding connections, or other engagements. In this way, for example, an ejector can operate as a linkage in order to appropriately direct and magnify a force applied by a user to eject an electric module.

As another example, in some embodiments, an actuation body of an ejector can be configured differently than the actuation bodies expressly illustrated in the FIGS. For example, in some embodiments, an actuation body can be configured as a push member or lever disposed to be actuated from a side of a relevant base, or in various other ways.

In some of the embodiments discussed above, an ejector is configured to contact a bottom surface of a housing of an electric module to eject the electric module from a base. In other embodiments, other configurations are possible. For example, an ejector can be configured to contact electrical connection terminals (e.g., tabs), alignment features, orientation features, fastening features, or keying features on a module, as appropriate for a particular installation and module configuration.

In some embodiments discussed above, an ejector is configured to be actuated directly by manual, tool-less engagement. In some embodiments, ejectors according to the invention can be alternatively (or additionally) configured to be actuated by powered or non-powered tools in order to eject a module from a base.

Thus, embodiments of the inventions can provide improved systems for ejecting electric modules from an associated base. In some embodiments, for example, an ejection body can be configured to pivot based on manually applied force in order to readily remove a surge protection module from an associated base. In this regard, for example, embodiments of the invention can improve the ease of use of surge protection systems, including during installation and replacement of surge protection modules.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A surge protection system for use with a surge protection module, the surge protection module including a locking recess, the surge protection system comprising:
a base configured to receive the surge protection module for operation; and
an ejector lever pivotably secured to the base at a first pivot point, the ejector lever being integrally formed to include a first leg, a first ejection feature that extends from the first leg, and a manual-engagement feature;
the first leg being configured to extend from the first pivot point along a first side of the surge protection module, with the surge protection module secured to the base; and
the manual-engagement feature being configured to be manually engaged to pivot the ejector lever relative to the base, about the first pivot point, to urge the first ejection feature into engagement with the surge protection module and thereby eject the surge protection module from engagement with the base,
wherein the ejector lever further includes a locking tab that is configured to engage the locking recess to secure the surge protection module to the base.

2. The surge protection system of claim 1, for use with a plurality of surge protection modules, wherein the base is configured to simultaneously receive each of the surge protection modules for operation; and
wherein the ejector lever is one of a plurality of ejector levers, each pivotably secured to the base and configured to be manually pivoted relative to the base to eject an associated one of the surge protection modules.

3. The surge protection system of claim 1, with the surge protection module including a rail, wherein the first ejection feature extends from the first leg to define a recess that is configured to receive the rail when the surge protection module is secured to the base.

4. A surge protection system for use with a self-contained surge protection module that includes rails, the surge protection system comprising:
a base configured to receive the self-contained surge protection module for operation; and
an ejector secured to the base, the ejector including a lever;
the ejector being configured to be manually moved relative to the base to pivot the lever relative to the base to an ejection orientation, to eject the self-contained surge protection module from engagement with the base while the lever remains secured to the base;
wherein the base includes an engagement block that is configured to pivotably engage the lever;
wherein the engagement block includes laterally opposed first block recesses that are configured to receive ejection features of the ejector to allow the self-contained surge protection module to seat against the engagement block when the self-contained surge protection module is secured to the base, the ejection features including ejector recesses that are configured to receive the rails when the self-contained surge protection module is secured to the base; and
wherein the engagement block includes second block recesses that are aligned with the ejector recesses when the ejection features are received in the first block recesses, to also receive the rails when the self-contained surge protection module is secured to the base.

5. The surge protection system of claim 4, with the self-contained surge protection module including a locking feature, wherein the lever is configured to be pivoted between an engaged orientation and the ejection orientation; and
wherein the lever includes a locking tab that is configured to engage the locking feature to secure the self-contained surge protection module to the base when the lever is in the engaged orientation.

6. The surge protection system of claim 5, wherein a first end of the lever is pivotally secured to the base; and
wherein the locking tab is disposed on a second end of the lever that is opposite the first end.

7. The surge protection system of claim 4, with the self-contained surge protection module including at least one rail, wherein the lever includes at least one recess that is configured to receive the rail when the self-contained surge protection module is secured to the base.

8. The surge protection system of claim 4, wherein the ejector is formed as an integral solid body that includes the lever.

9. The surge protection system of claim 4, wherein the lever includes a first leg and a second leg that are configured to extend, respectively, along first and second opposing sides of the self-contained surge protection module when the self-contained surge protection module is engaged with the base.

10. The surge protection system of claim 9, wherein each of the first and second legs separately pivotably engages the base and wherein a linking section joins the first and second legs opposite the pivotable engagement with the base.

11. The surge protection system of claim 10, wherein the linking section includes a locking tab configured to engage the self-contained surge protection module to secure the self-contained surge protection module to the base.

12. The surge protection system of claim 11, wherein the first and second legs are configured to extend, respectively, partly along central portions of the first and second opposing sides of the self-contained surge protection module; and
wherein the linking section is configured to extend along a third side of the self-contained surge protection module that joins the first and second opposing sides.

13. An ejector for a surge protection module, the surge protection module including a locking recess and configured to be engaged with a base for operation, the ejector comprising:
an ejector lever, pivotably secured to the base but not pivotably secured to the surge protection module;
the ejector lever being configured to be manually pivoted relative to the base from an engaged orientation to an ejection orientation, without being disconnected from the base, to eject the surge protection module from engagement with the base; and
the ejector lever being configured to be pivoted by the surge protection module, from the ejection orientation to the engaged orientation, as the surge protection module is engaged with the base,
wherein the ejector lever includes a locking tab that is configured to engage the locking recess to secure the surge protection module to the base when the ejector lever is in the engaged orientation.

14. The ejector of claim 13, wherein the ejector lever includes a first leg and a second leg that are configured to extend, respectively, along first and second opposing sides of the surge protection module when the surge protection module is engaged with the base.

15. The ejector of claim 14, with the surge protection module including a first rail and a second rail, wherein each of the first and second legs supports, respectively, an ejection feature with a recess that is configured to receive a corresponding one of the first or second rails when the surge protection module is engaged with the base; and wherein the ejection features are configured to urge the surge protection module out of engagement with the base when the ejector lever is pivoted from the engaged orientation to the ejection orientation.

16. The ejector of claim 15, with the base including an engagement block with a support surface on which the surge protection module is configured to seat when the surge protection module is engaged with the base, wherein the ejection features of the first and second legs are configured to be recessed below the support surface of the engagement block when the ejector lever is in the engaged orientation.

\* \* \* \* \*